(12) United States Patent
Chau et al.

(10) Patent No.: US 10,551,409 B2
(45) Date of Patent: *Feb. 4, 2020

(54) MECHANICAL SHOCK RESISTANT MEMS ACCELEROMETER ARRANGEMENT, ASSOCIATED METHOD, APPARATUS AND SYSTEM

(71) Applicant: Merlin Technology, Inc., Kent, WA (US)

(72) Inventors: Albert W. Chau, Woodinville, WA (US); John E. Mercer, Gig Harbor, WA (US); Scott Phillips, Kent, WA (US)

(73) Assignee: Merlin Technology, Inc., Kent, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/973,277

(22) Filed: May 7, 2018

(65) Prior Publication Data

US 2018/0252746 A1 Sep. 6, 2018

Related U.S. Application Data

(63) Continuation of application No. 15/371,497, filed on Dec. 7, 2016, now Pat. No. 9,983,227, which is a
(Continued)

(51) Int. Cl.
*G01P 15/18* (2013.01)
*G01P 3/00* (2006.01)
(Continued)

(52) U.S. Cl.
CPC ............... *G01P 15/18* (2013.01); *G01P 3/00* (2013.01); *G01P 15/00* (2013.01); *G01P 15/0888* (2013.01); *B81B 2201/0235* (2013.01)

(58) Field of Classification Search
CPC ...... G01P 15/18; G01P 1/023; G01P 15/0888; G01P 15/00; G01P 1/02; G01P 3/00;
(Continued)

(56) References Cited

U.S. PATENT DOCUMENTS 3,788,149 A 1/1974 Wilner
4,590,801 A 5/1986 Merhav
(Continued)

FOREIGN PATENT DOCUMENTS

CN 103776448 A 5/2014
WO WO 2010/057055 5/2010
(Continued)

OTHER PUBLICATIONS

First Examination Office Action for European Application No. 15814989.8 which is associated with International Application No. PCT/US2015/038920 which is associated with U.S. Appl. No. 14/789,071, dated Aug. 28, 2018, Munich, Germany.
(Continued)

*Primary Examiner* — Daniel S Larkin
*Assistant Examiner* — Anthony W Megna Fuentes
(74) *Attorney, Agent, or Firm* — Pritzkau Patent Group, LLC

(57) ABSTRACT

An accelerometer arrangement and method are described for determining accelerations of an inground tool. First and second triaxial accelerometers are supported such that a normal sensing axis of the first triaxial accelerometer is at least generally orthogonal to the normal sensing axis of the second triaxial accelerometer for determining the accelerations along the three orthogonal axes based on a combination of sensing axis outputs from one or both of the triaxial accelerometers. A weaker sensing axis of one triaxial accelerometer can be supported at least approximately normal to a weaker sensing axis of another triaxial accelerometer such
(Continued)

that the weaker axes are not used. The triaxial accelerometers can be supported such that one axis of one accelerometer can be redundant with respect to another axis of another accelerometer. One triaxial accelerometer can be mounted on a tilted plane with respect to another triaxial accelerometer.

12 Claims, 5 Drawing Sheets

Related U.S. Application Data continuation of application No. 14/789,071, filed on Jul. 1, 2015, now Pat. No. 9,551,730.

(60) Provisional application No. 62/021,618, filed on Jul. 7, 2014, provisional application No. 62/019,887, filed on Jul. 2, 2014.

(51) Int. Cl.
 *G01P 15/00* (2006.01)
 *G01P 15/08* (2006.01)

(58) Field of Classification Search
 CPC .... B81B 2201/0235; A61B 2562/0219; A63B 2220/40; B60R 21/013
 See application file for complete search history.

(56) References Cited

U.S. PATENT DOCUMENTS

| | | | |
|---|---|---|---|
| 5,585,726 A * | 12/1996 | Chau | E21B 47/02224 175/45 |
| 5,848,383 A | 12/1998 | Yunus | |
| 6,031,317 A | 2/2000 | Chen | |
| 6,722,203 B1 | 4/2004 | Evans et al. | |
| 7,028,779 B2 | 4/2006 | Chau | |
| 8,042,396 B2 | 10/2011 | Coronato et al. | |
| 8,662,200 B2 | 3/2014 | Chau et al. | |
| 2002/0088932 A1 | 7/2002 | Kelleher | |
| 2003/0070483 A1 | 4/2003 | Mueller | |
| 2004/0266480 A1 | 12/2004 | Hjelt et al. | |
| 2006/0185432 A1 | 8/2006 | Weinberg | |
| 2006/0267189 A1 | 11/2006 | Usui | |
| 2008/0136564 A1 | 6/2008 | Winfree | |
| 2009/0056446 A1 | 3/2009 | Cluff et al. | |
| 2009/0255335 A1 | 10/2009 | Fly | |
| 2011/0291644 A1 | 12/2011 | Kanemoto | |
| 2012/0218863 A1 | 8/2012 | Chau | |
| 2013/0173207 A1 | 7/2013 | Tanenhaus | |
| 2013/0176139 A1 | 7/2013 | Chau et al. | |
| 2013/0239650 A1 | 9/2013 | Chau et al. | |
| 2014/0111839 A1 | 4/2014 | Suzuki | |
| 2014/0123754 A1 | 5/2014 | Watanabe | |
| 2014/0318245 A1 | 10/2014 | Perego | |

FOREIGN PATENT DOCUMENTS

| WO | WO 2010/065272 A2 | 6/2010 |
|---|---|---|
| WO | WO 2011/144883 | 11/2011 |
| WO | WO 2011/144883 A1 | 11/2011 |

OTHER PUBLICATIONS

The Third Office Action of The State Intellectual Property Office of People's Republic of China for Chinese Application No. 201580020102.2 which is associated with International Application No. PCT/US2015/038920 which is associated with U.S. Appl. No. 14/789,071, dated Oct. 26, 2018. (Global Dossier translation included).
Machine translation of the previously cited reference: The Third Office Action of The State Intellectual Property Office of People's Republic of China for Chinese Application No. 201580020102.2 which is associated with International Application No. PCT/US2015/038920 which is associated with U.S. Appl. No. 14/789,071, dated Oct. 26, 2018.
The International Search Report and The Written Opinion of the International Searching Authority for International Application No. PCT/US2015/038920 which is associated with U.S. Appl. No. 14/789,071, dated Nov. 12, 2015, Moscow, Russia.
International Preliminary Report on Patentability from the International Preliminary Examining Authority for International Application No. PCT/US2015/038920 which is associated with U.S. Appl. No. 14/789,071, dated Nov. 3, 2016, Moscow, Russia.
Extended European Search Report for European Application No. 15814989.8 which is associated with International Application No. PCT/US2015/038920 which is associated with U.S. Appl. No. 14/789,071, dated Jan. 15, 2018, Munich, Germany.
The First Office Action of The State Intellectual Property Office of People's Republic of China for Chinese Application No. 201580020102.2 which is associated with International Application No. PCT/US2015/038920 which is associated with U.S. Appl. No. 14/789,071, dated Nov. 3, 2017. (English translation included).
English Translation of previously cited Chinese Patent No. CN103776448, published on Feb. 17, 2014.
English translation of the previously cited Third Office Action of The State Intellectual Property Office of People's Republic of China for Chinese Application No. 201580020102.2 which is associated with International Application No. PCT/US2015/038920 which is associated with U.S. Appl. No. 14/789,071, dated Oct. 26, 2018.
Machine translation of the previously cited reference: The First Office Action of The State Intellectual Property Office of People's Republic of China for Chinese Application No. 201580020102.2 which is associated with International Application No. PCT/US2015/038920 which is associated with U.S. Appl. No. 14/789,071, dated Nov. 3, 2017.
The Second Office Action of The State Intellectual Property Office of People's Republic of China for Chinese Application No. 201580020102.2 which is associated with International Application No. PCT/US2015/038920 which is associated with U.S. Appl. No. 14/789,071, dated May 9, 2018. (Machine translation included).
Written Opinion of the International Preliminary Examining Authority for International Application No. PCT/US2015/038920 which is associated with U.S. Appl. No. 14/789,071, dated Aug. 12, 2016, Russia.
The Refusal Decision of The State Intellectual Property Office of People's Republic of China for Chinese Application No. 201580020102.2 which is associated with International Application No. PCT/US2015/038920 which is associated ith U.S. Appl. No. 141789,071, dated Apr. 29, 2019. (Machine translation included).

* cited by examiner

MECHANICAL SHOCK RESISTANT MEMS ACCELEROMETER ARRANGEMENT, ASSOCIATED METHOD, APPARATUS AND SYSTEM

RELATED APPLICATIONS

This application is a continuation application of copending U.S. patent application Ser. No. 15/371,497 filed on Dec. 7, 2016, which is a continuation application of U.S. patent application Ser. No. 14/789,071, filed on Jul. 1, 2015 and issued as U.S. Pat. No. 9,551,730 on Jan. 24, 2017, which claims priority from U.S. Provisional Patent Application Ser. No. 62/021,618, filed on Jul. 7, 2014 and U.S. Provisional Patent Application Ser. No. 62/019,887, filed on Jul. 2, 2014, the disclosures of which are incorporated herein by reference.

BACKGROUND

The present application is generally related to MEMS accelerometers and, more particularly, to a MEMS accelerometer package having enhanced resistance to mechanical shock as well as an associated method, apparatus and system.

Accelerometers have become ubiquitous in modern electronic devices. In this regard, the measurement of acceleration along three orthogonal axes can provide for essentially complete characterization of device orientation. An accelerometer that is configured for measuring accelerations along three orthogonal axes in a single, convenient package is often referred to as a triaxial accelerometer.

Many modern electronic systems employ accelerometers for a wide range of purposes. As a general example, the operational state or physical orientation of an associated device can be characterized. As another more device specific example, an accelerometer can be used to detect that a hard disk drive is in a state of free fall such that the read/write heads of the drive can be parked in anticipation of mechanical shock upon impending impact. As still another device specific example, modern cellular smart phones typically include an accelerometer to determine the orientation of the phone for display orientation management and for use by a wide range of applications that can be installed on the smart phone. It is noted that the need for accelerometers suited for consumer-grade electronics such as cellular smart phones has driven the development of MEMS triaxial accelerometers that are typically low-cost.

As still another device specific example, an accelerometer can be used as part of a transmitter that is carried by an inground tool in a horizontal directional drilling system for monitoring the orientation and movement of the inground tool. Such monitoring can facilitate steering as well as monitoring the position of the inground tool. As will be described in detail below, Applicants recognize that the use of consumer-grade low-cost accelerometers in a device that subjects the accelerometer to a mechanical shock and vibration environment can lead to failures of these devices. While the overall failure rate has historically not been high, any premature failure of a transmitter can result in significant problems, including idling a crew and equipment while a new transmitter is obtained, missing deadlines, as well as the cost involved with purchasing a new transmitter. To date, the industry has continued to use these accelerometers for lack of an identified, practical alternative.

The present application brings to light a new approach which provides for the use of low-cost consumer-grade accelerometers in a high mechanical shock and vibration environment in a way which enhances reliability.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In general, an accelerometer arrangement and method are described for determining accelerations of an inground tool along three orthogonal axes during an inground operation that exposes the accelerometer arrangement to a mechanical shock and vibration environment. In one aspect of the disclosure, the accelerometer arrangement includes a first MEMS triaxial accelerometer and a second MEMS triaxial accelerometer, each of which includes a set of three orthogonally arranged accelerometer sensing axes including a pair of in-plane sensing axes and a normal sensing axis such that the normal sensing axis is subject to a higher rate of failure responsive to mechanical shock and vibration than the in-plane sensing axes. A support structure supports the first and second triaxial accelerometers such that the normal sensing axis of the first triaxial accelerometer is at least generally orthogonal to the normal sensing axis of the second triaxial accelerometer. A processor determines the accelerations along the three orthogonal axes based on a combination of sensing axis outputs from one or both of the first and second triaxial accelerometers.

In another aspect of the disclosure, the accelerometer arrangement includes a first MEMS triaxial accelerometer and a second MEMS triaxial accelerometer, each of which includes a weaker sensing axis that is more susceptible to mechanical shock and vibration than the other two sensing axes. A support structure supports the first and second triaxial accelerometers such that the weaker sensing axis of the first triaxial accelerometer is at least approximately normal to the weaker sensing axis of the second triaxial accelerometer. A processor determines the accelerations along the three orthogonal axes based on a combination of sensing axis outputs from the first and second triaxial accelerometers without using the weaker sensing axis of each of the first and second triaxial accelerometers.

In still another aspect of the disclosure, the accelerometer arrangement includes a first accelerometer package and a second accelerometer package, each of which includes one or more sensing axes such that the first and second accelerometer packages collectively provide a total of at least four sensing axes for sensing along the three orthogonal axes. A support structure supports the first and second accelerometers such that at least one sensing axis of the first accelerometer package is redundant with respect to at least one sensing axis of the second accelerometer package. A processor is configured to select a combination of three sensing axes from the total number of sensing axes for determining the accelerations along the three orthogonal axes.

In yet another embodiment of the present disclosure, the accelerometer arrangement includes a first MEMS triaxial accelerometer and a second MEMS triaxial accelerometer. A support structure supports the first and second triaxial accelerometers such that the first triaxial accelerometer is supported on a first plane that forms an angle of at least approximately 45 degrees with respect to a second plane that supports the second triaxial accelerometer. A processor determines the accelerations along the three orthogonal axes based on a combination of sensing axis outputs from the first and second triaxial accelerometers.

BRIEF DESCRIPTIONS OF THE DRAWINGS

Example embodiments are illustrated in referenced figures of the drawings. It is intended that the embodiments and figures disclosed herein are to be illustrative rather than limiting.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiment shown, but is to be accorded the widest scope consistent with the principles and features described herein including modifications and equivalents, as defined within the scope of the appended claims. It is noted that the drawings are not to scale and are diagrammatic in nature in a way that is thought to best illustrate features of interest. Descriptive terminology may be used with respect to these descriptions, however, this terminology has been adopted with the intent of facilitating the reader's understanding and is not intended as being limiting. Further, the figures are not to scale for purposes of illustrative clarity.

Figure 1:
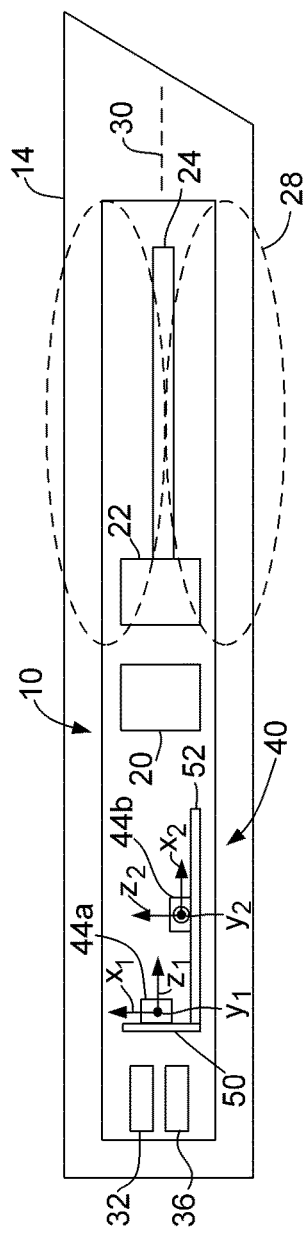
FIG. 1 is a diagrammatic view, in elevation, of a transmitter, according to the present disclosure, which utilizes dual triaxial MEMS accelerometers.

Turning now to the figures wherein like components are indicated by like reference numbers throughout the various figures, attention is immediately directed to FIG. 1 which is an elevational view that diagrammatically illustrates an embodiment of a transmitter, generally indicated by the reference number 10, for use in a horizontal directional drilling system. Transmitter 10 is supported by an inground tool 14 such as, for example, a boring tool for performing a drilling operation or a tension monitoring arrangement used with a back-reaming tool for performing a pull-back operation. As will become apparent, the present disclosure is relevant with respect to any application which subjects certain components to a mechanical shock and vibration environment.

Transmitter 10 includes a processor 20 in communication with a transmitter section 22 that is coupled to an antenna 24 for emitting a signal 28 such as, for example, a locating signal which can be a dipole signal. The transmitter can include an elongation axis 30 that can at least generally align with an elongation axis of inground tool 14 when the transmitter is installed therein. It is noted that inter-component cabling is not shown in FIG. 1 for purposes of illustrative clarity, but is understood to be present. In another embodiment, transmitter section 10 can comprise a transceiver for also receiving an incoming electromagnetic signal. In still another embodiment, above ground communication can be implemented by using a drill string (not shown) that is attached to inground tool 14 as an electrical conductor as described, for example, in U.S. Published Application no. 2013/0176139 which is hereby incorporated by reference in its entirety. It should be appreciated that the teachings herein remain applicable irrespective of the particular communication pathway or pathways that are implemented. Any appropriate combination of sensors can be provided as part of the transmitter such as, for example, a pressure sensor 32, a temperature sensor 36 and an accelerometer arrangement 40. Data collected from these various sensors by processor 20 can be transmitted, for example, by modulating signal 28.

Figure 2:
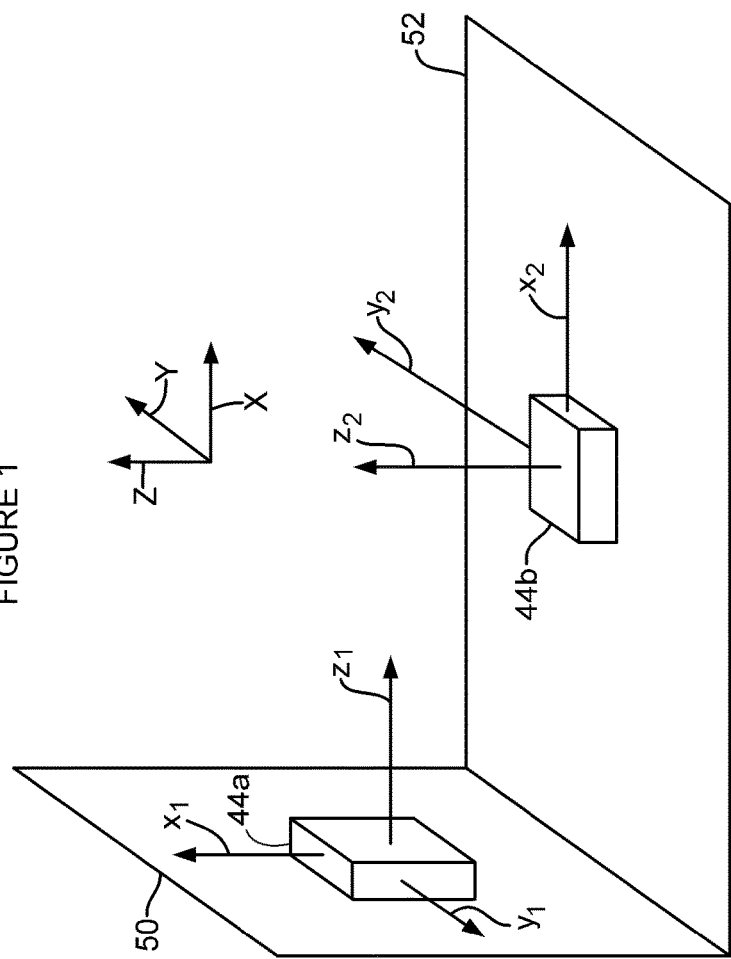
FIG. 2 is a diagrammatic perspective view of an embodiment of the accelerometer arrangement of the transmitter of FIG. 1.

Referring to FIG. 2 in conjunction with FIG. 1, in one embodiment, accelerometer arrangement 40 comprises a MEMS accelerometer arrangement that is supported within transmitter 10. The MEMS accelerometer arrangement includes a first triaxial MEMS accelerometer 44a and a second triaxial MEMS accelerometer 44b. It is noted that these accelerometers may be referred to collectively by the reference number 44. FIG. 2 is an enlarged diagrammatic view, in perspective, of MEMS accelerometer package 40. First triaxial MEMS accelerometer 44a includes orthogonal sensing axes $x_1$, $y_1$ and $z_1$, while second triaxial MEMS accelerometer 44b includes orthogonal sensing axes $x_2$, $y_2$ and $z_2$. It is noted that axes $x_2$ and $z_1$ can be at least approximately aligned or parallel with elongation axis 30, although this is not required. The triaxial accelerometers can be supported and electrically connected in any suitable manner. In the present example, a first printed circuit board 50 supports and electrically connects triaxial MEMS accelerometer 44a while a second printed circuit board 52 supports and electrically connects second triaxial MEMS accelerometer 44b. Generally, the same part number can be used for both triaxial MEMS accelerometers, although this is not required. The triaxial MEMS accelerometers can be inexpensive, consumer-grade MEMS accelerometers such as, for example, those that are found in cellular telephones. One non-limiting example of such a consumer-grade triaxial accelerometer is the MMA 8451Q manufactured by Freescale Semiconductor. In the present embodiment, accelerometers 44 are configured with an I2C interface such that processor 20 accesses readings along each axis by reading from specific memory locations within each triaxial accelerometer, although any suitable form of interface, including analog, can be utilized.

Triaxial MEMS accelerometers have become the most widely available, and in many cases least expensive, accelerometers available in the market. These accelerometers have become pervasive in applications ranging from cellular telephones to toys. However, underground drilling can subject accelerometers to higher and/or more prolonged levels of mechanical shock that may in some circumstances exceed the thresholds for which these components are typically designed. In particular, Applicants recognize that the z-axis, which can be referred to as a normal axis or a weaker axis, of triaxial MEMS accelerometers tend to fail more often than other axes, which can be referred to as the in-plane axes, when exposed to extreme shock conditions, thereby limiting the overall performance of the component. Manufacturers of locating systems use these components in spite of this limitation in the absence of a more suitable alternative. The teachings that are brought to light herein compensate for this limitation, providing the potential for a significantly higher level of reliability when these accelerometers are used in underground drilling applications or other conditions of extreme mechanical shock.

As best seen in the perspective view of FIG. 2, MEMS accelerometer 44a is mounted orthogonal to MEMS accelerometer 44b such that the $z_1$ axis of accelerometer 44a is at least approximately orthogonal to the $z_2$ axis of accelerometer 44b and the $x_1$, $y_1$ plane is at least approximately orthogonal to the $x_2$, $y_2$ plane. It is noted that the x and y sensing axes of a given accelerometer may be referred to as the in-plane axes since these axes define a plane that is at least generally parallel to the surface on which the triaxial accelerometer package is supported, while the z axis may be referred to as a normal axis. In an embodiment, accelerometer readings for three orthogonally disposed axes can be obtained based on sensing along axis $x_1$ of accelerometer 44a as well as along axes $x_2$ and $y_2$ of accelerometer 44b such that the $x_1$ accelerometer readings are used in place of $z_2$ readings from accelerometer 44b. In another embodiment, accelerometer readings can be obtained based on sensing along axes $x_1$ and $y_1$ of accelerometer 44a and along axis $x_2$ of accelerometer 44b such that the $x_2$ accelerometer readings are used in place of $z_1$ readings from accelerometer 44a. In either of these embodiments, no sensor readings are needed from the z axes of the dual accelerometers. Stated in another way, two triaxial MEMS accelerometer packages can be mounted normal or orthogonal to one another, thereby allowing the normal accelerometer in one package to be replaced by an in-plane accelerometer in the other package. This solution provides for more than the simple redundancy of using multiple accelerometers in the standard manner (i.e. using all three axes), since this would still expose the device to potential failure of the z-axis. By contrast, Applicant's configuration is specifically designed to eliminate the recognized weakest link in these components—namely, the z-axis.

Figure 3:
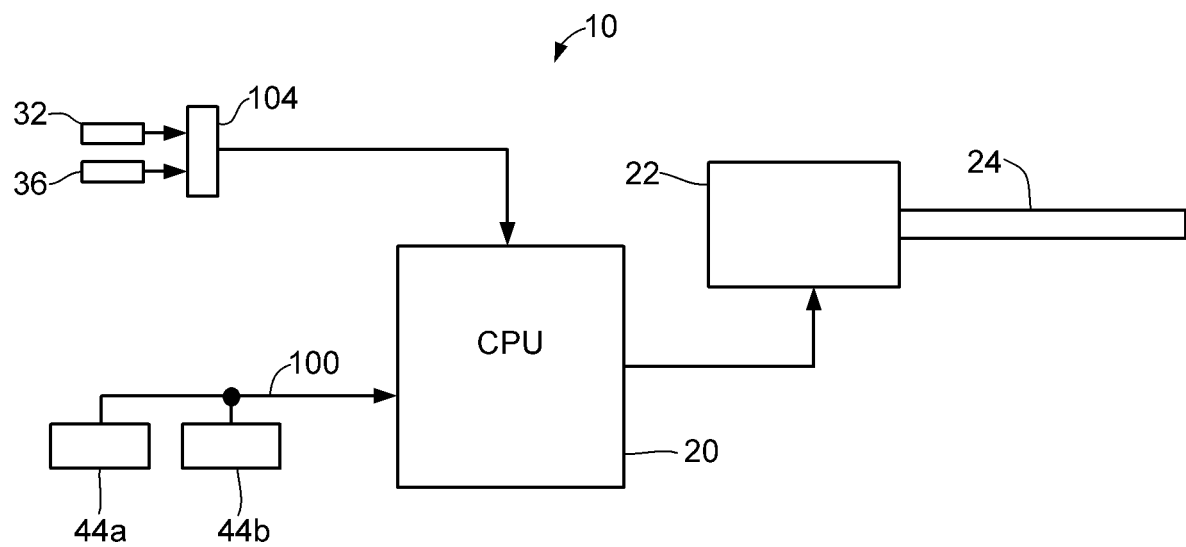
FIG. 3 is a schematic diagram illustrating an embodiment of the transmitter of FIG. 1.

Referring to FIG. 3, a schematic diagram of an embodiment of transmitter 10 is illustrated. Descriptions of like components will not be repeated for purposes of brevity. In the present embodiment, an I2C interface 100 connects triaxial MEMS accelerometers 44a and 44b to CPU 20. Pressure sensor 32 and temperature sensor 36 can be interfaced to processor 20 using an analog to digital converter 104, if either sensor is an analog sensor.

Figure 4:
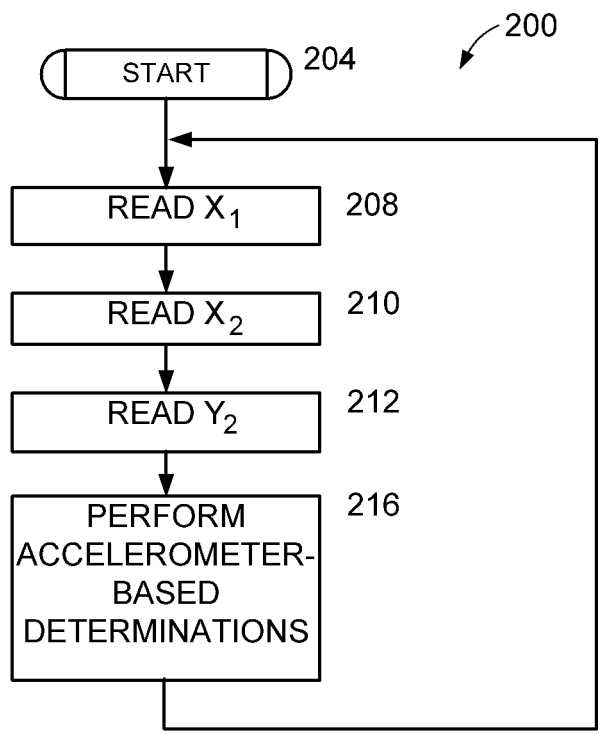
FIG. 4 is a flow diagram that illustrates an embodiment for the operation of the transmitter of FIG. 1.

FIG. 4 is a flow diagram that illustrates one embodiment of a method, generally indicated by the reference number 200, for the operation of transmitter 10 in accordance with the present disclosure. The method begins at start 204 and proceeds to 208 which reads axis $x_1$ of accelerometer 44a. At 210, axis $x_2$ of accelerometer 44b is read followed by reading axis $y_2$ of accelerometer 44b at 212. The various accelerometer axes can be read individually, in any suitable order or combination, based on the parameter or parameters that are being determined. Such parameters include, by way of non-limiting example, pitch and roll of inground tool 14.

At 216, the accelerometer readings are used to perform determinations such as, for example, pitch and/or roll orientation parameters.

Figure 5:
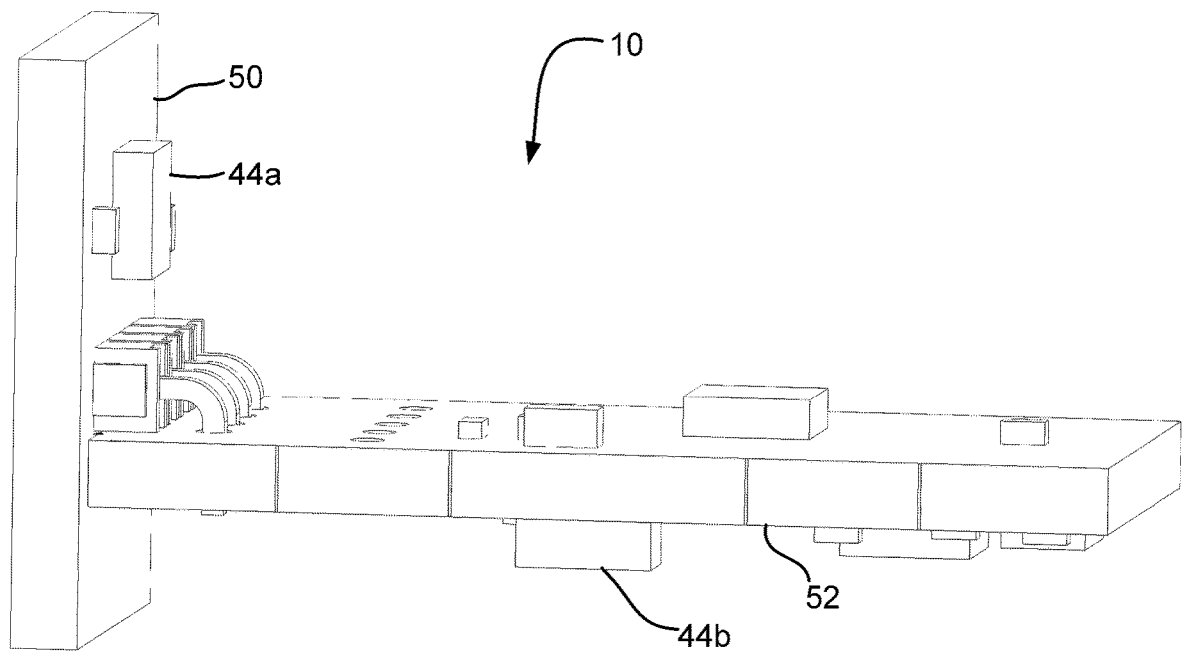
FIGS. 5 and 6 are diagrammatic views, in perspective, of an embodiment of the accelerometer arrangement of FIG. 1.
Figure 6:
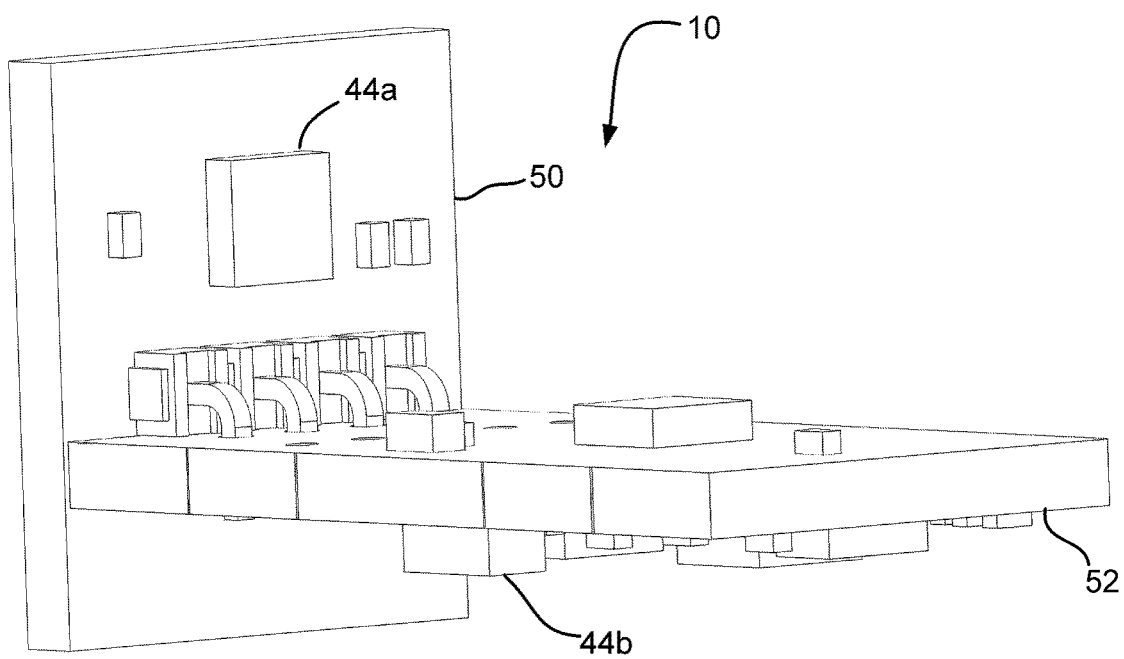

FIGS. 5 and 6 are diagrammatic views, in perspective of an embodiment of accelerometer arrangement 40, shown here for further illustrative purposes.

It should be appreciated that in addition to providing a robust accelerometer arrangement using low-cost triaxial MEMS accelerometers, still further benefits are provided by the foregoing embodiments. For example, redundancy can be provided with respect to accelerometer readings. Referring to FIG. 2, in an embodiment that uses axes $x_1$, $x_2$ and $y_2$, axis $y_1$ of accelerometer 44a is unused and can be used in place of axis $y_2$ of accelerometer 44b, for example, if a failure of $y_2$ is experienced.

The teachings that have been brought to light above can readily be applied to other embodiments that are considered as being within the scope of the present application so long as a given embodiment practices avoiding the use of a weaker axis. For example, in one embodiment, a dual accelerometer arrangement can comprise a pair of dual axis accelerometers such that the normal, z, or weaker axis is not present in either accelerometer and the dual accelerometers are supported at least approximately normal or orthogonal to one another such that an in-plane axis of one of the dual axis accelerometers serves as a z or normal axis. In another embodiment, a triaxial accelerometer can be paired with a dual axis accelerometer such that an in-plane axis of the dual axis accelerometer is supported to serve in place of the weaker, z, or normal axis of the triaxial accelerometer. In still another embodiment, a triaxial accelerometer can be paired with a single axis accelerometer such that the single axis accelerometer is supported to serve in place of the weaker, z, or normal axis of the triaxial accelerometer. In yet another embodiment, a dual axis accelerometer having a pair of in-plane accelerometers can be paired with a single axis accelerometer such that the single axis accelerometer is arranged at least approximately normal or orthogonal to the in-plane accelerometers of the dual axis accelerometer.

While the foregoing teachings provide for a much hardier accelerometer package overall, additional robustness can be obtained from the two tri-axial packages, as will be described immediately hereinafter.

It should be appreciated that two tri-axial packages can provide eight combinations of accelerometers that can serve as a single tri-axial accelerometer with two accelerometers being available for each Cartesian direction. Table 1 lists the combinations in light of the accelerometer axes shown in FIG. 2. It is noted that a set of master coordinate axes X,Y,Z are shown in FIG. 2 such that the final column of Table 1 indicates the sign associated with the respective master coordinate axis for each sensing axis of a given combination.

TABLE 1

AVAILABLE COMBINATIONS OF AXES FOR DUAL TRIAXIAL ACCELEROMETERS

| Combination no. | Axes of Combination | Master Coordinate Axes | Pitch Ø | Roll β |
|---|---|---|---|---|
| 1* | $x_2, y_2, x_1$ | X, Y, Z | $\sin^{-1} x_2$ | $\tan^{-1} (x_1/y_2)$ |
| 2 | $x_2, y_1, z_2$ | X, -Y, Z | $\sin^{-1} x_2$ | $\tan^{-1} (z_2/y_1)$ |
| 3 | $z_1, y_2, z_2$ | X, Y, Z | $\sin^{-1} z_1$ | $\tan^{-1} (z_2/y_2)$ |
| 4* | $x_2, y_1, x_1$ | X, -Y, Z | $\sin^{-1} x_2$ | $\tan^{-1} (x_1/y_1)$ |
| 5 | $z_1, y_2, x_1$ | X, Y, Z | $\sin^{-1} z_1$ | $\tan^{-1} (x_1/y_2)$ |

TABLE 1-continued

AVAILABLE COMBINATIONS OF AXES FOR
DUAL TRIAXIAL ACCELEROMETERS

| Combination no. | Axes of Combination | Master Coordinate Axes | Pitch Ø | Roll β |
|---|---|---|---|---|
| 6 | $z_1, y_1, z_2$ | X, -Y, Z | $\sin^{-1} z_1$ | $\tan^{-1}(z_2/y_1)$ |
| 7 | $z_1, y_1, x_1$ | X, -Y, Z | $\sin^{-1} z_1$ | $\tan^{-1}(x_1/y_1)$ |
| 8 | $x_2, y_2, z_2$ | X, Y, Z | $\sin^{-1} x_2$ | $\tan^{-1}(z_2/y_2)$ |

*enhanced reliability

As denoted by asterisks in Table 1, there are two combinations, 1 and 4, that provide the hardiest arrangement by eliminating all use of the normal accelerometer in both accelerometer packages.

For combinations 1, 2, 4 and 8, pitch, which is designated as Ø, is given as:

$$\emptyset = \sin^{-1} x_2 \qquad \text{EQN (1)}$$

While roll, designated as β, for combinations 1 and 5 is given, by way of example, as:

$$\beta = \tan^{-1}\left[\frac{x_1}{y_2}\right] \qquad \text{EQN (2)}$$

And roll for combinations 2 and 6 is given, by way of example, as:

$$\beta = \tan^{-1}\left[\frac{z_2}{y_1}\right] \qquad \text{EQN (3)}$$

Applicants recognize that the proper functionality of each combination in Table 1 can be verified by summing the squares of the three accelerations for each combination. The sum should equal gravitational acceleration, g, squared. Representing the three accelerometer readings for each combination generically using the variables a, b and c:

$$g2 = a2 + b2 + c2 \qquad \text{EQN (4)}$$

In actual practice, a range limit can be placed on the sum of the squares of Equation 4 to account for accuracy of the accelerometers and other measurement errors such that the accelerometers associated with a particular sum of the Equation 4 can be deemed as operating correctly so long as the sum falls between $g_{min}^2$ and $g_{max}^2$. Suitable values for $g_{min}^2$ and $g_{max}^2$, by way of non-limiting example, are at least approximately 0.958 $g^2$ and 1.05 $g^2$, respectively, or a change of +/−5 percent from 1 g.

In an embodiment, an ordered list of accelerometer combinations, having the most reliable combinations at the top of the list as a preference, can be utilized to determine which accelerometer combination to use. Table 2 represents one embodiment of such an ordered list wherein the combination numbers from Table 1 are set forth.

TABLE 2

PRIORITY TABLE FOR DUAL
TRIAXIAL ACCELEROMETERS

| Priority Order | Combination no. | Axes of Combination |
|---|---|---|
| 1 | 1* | $x_2, y_2, x_1$ |
| 2 | 4* | $x_2, y_1, x_1$ |

TABLE 2-continued

PRIORITY TABLE FOR DUAL
TRIAXIAL ACCELEROMETERS

| Priority Order | Combination no. | Axes of Combination |
|---|---|---|
| 3 | 2 | $x_2, y_1, z_2$ |
| 4 | 3 | $z_1, y_2, z_2$ |
| 5 | 5 | $z_1, y_2, x_1$ |
| 6 | 6 | $z_1, y_1, z_2$ |
| 7 | 7 | $z_1, y_1, x_1$ |
| 8 | 8 | $x_2, y_2, z_2$ |

*enhanced reliability

It should be appreciated that the use of a priority table such as Table 2 does not require the use of one or more accelerometers having a weaker axis. Priority assignments can be made in accordance with any sort of concern that relates to reliability. By way of non-limiting example, such concerns can derive from the reliability of physical mounting, supporting electrical connections, environmental exposure, and history. In some embodiments, the priority table can be used even when the accelerometer axis combinations are thought to all exhibit at least generally the same reliability in order to provide an overall level of reliability that is submitted to be heretofore unseen.

Figure 7:
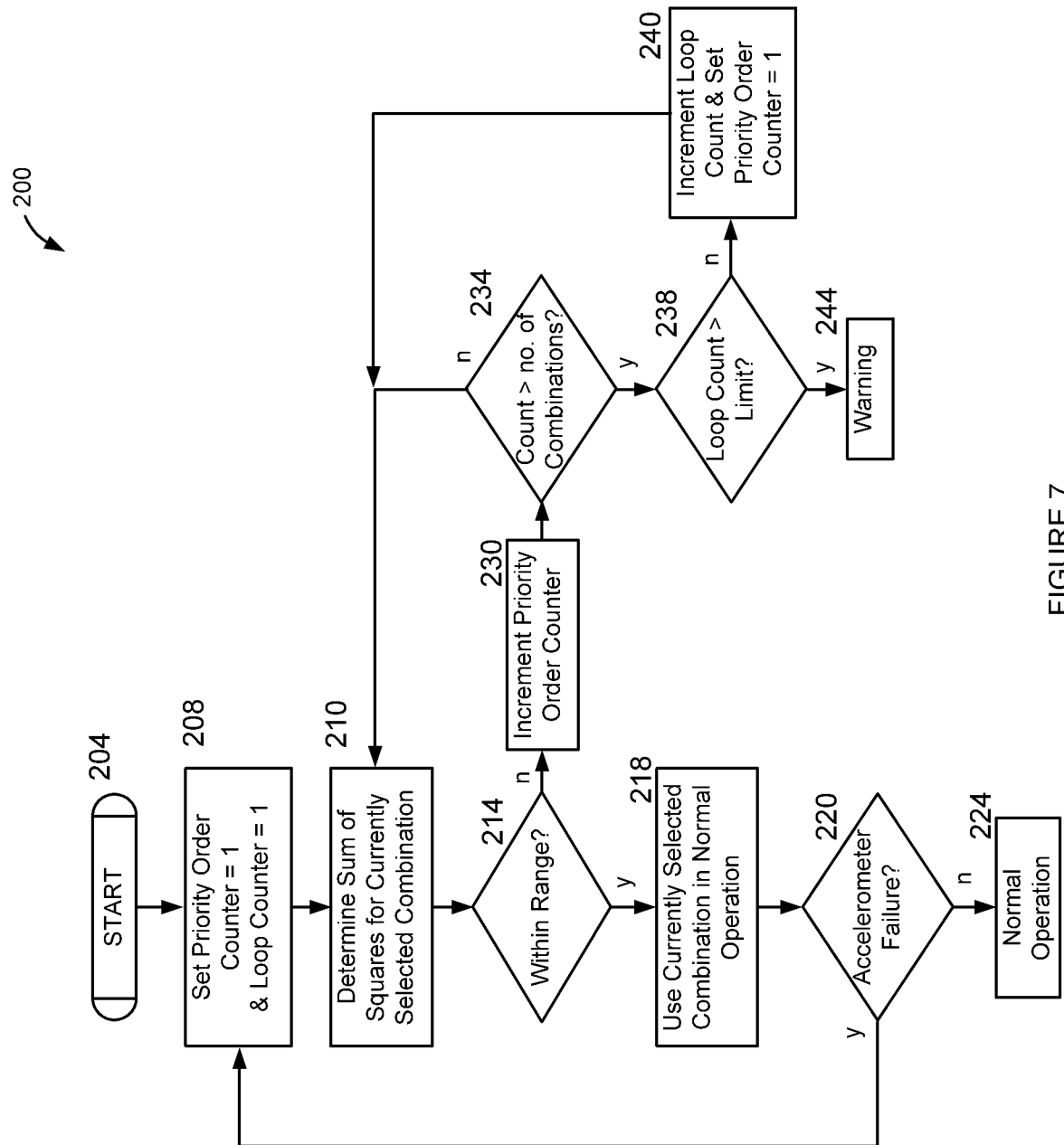
FIG. 7 is a flow diagram illustrating an embodiment of a method for operating a transmitter in accordance with the present application based on a priority table of sensing axis combinations derived from two or more accelerometers.

Referring to FIG. 7, an embodiment of a method is illustrated for operating transmitter 10 based on a priority table such as Table 2 is generally indicated by the reference number 200. Method 200 begins at start 204, for example, when the transmitter and accelerometers are first turned on and proceeds to 208. This latter step sets each of a priority counter and a loop counter to a value of 1. The purpose of the loop counter will be brought to light at an appropriate point hereinafter. At 210, a sum of the squares of the accelerometers for the first or highest order combination of accelerometers in Table 2 is produced. At 214, the sum of the squares value is tested against $gmin^2$ and $gmax^2$, if the value is within range, operation is routed to 218 such that the current combination of accelerometers is used for normal operation. During normal operation, the selected accelerometer combination can be periodically monitored and/or tested at 220 for failure, based on Equation 4 and/or any other suitable factors. If no failure is detected, normal operation resumes at 224. If an accelerometer failure is detected at 220, operation returns to 208 such that the procedure begins anew.

Returning to the discussion of 214, if the sum of the squares is out of range, operation proceeds to 230 which increments the value of the priority order counter by 1. At 234, the value of the priority order counter is tested against the total number of available accelerometer combinations in Table 2. If the current value of the priority order counter does not exceed the total number of available combinations, operation returns to 210 and proceeds therefrom. Otherwise, operation proceeds to 238 which tests the current value of the loop counter against a loop count limit. The purpose of the loop counter relates to the potential for MEMS accelerometers to become temporarily stuck due to static charge forces. Accordingly, it is not necessary to stop the accelerometer selection procedure based on reaching the bottom of the priority table list. Instead, the priority table list can be looped through repeatedly some number of times before the accelerometer package is declared unusable or the selection process can continue indefinitely in hopes that the accelerometers become functional. As part of the loop architecture, it should be appreciated that every available combination of sensing axes can be tested or re-tested including a combination that invoked the test procedure in the first instance, for example, based on detection by step 220. In this way, a previously failed combination that subsequently becomes functional can be placed back into service. It is noted that the test of step 238 and a loop architecture is not a requirement. In an embodiment that does not employ a loop count, step 214 can notify the operator that accelerometer testing is being performed each time this step is entered. If the loop count is not exceeded at 238, operation proceeds to 240 which increments the loop count and sets the priority order counter to 1. Operation then returns to 210 and proceeds therefrom. On the other hand, if 238 determines that the loop count exceeds a loop count limit, which can be established, for example, by the manufacturer, a warning can be issued to the operator at 244.

The method and associated apparatus described above can readily be used with additional accelerometer packages having any suitable number of sensing axes and/or a single sensing axis for even more redundancy. Further, the procedures of FIGS. 4 and 7 are not limited to tri-axial accelerometer packages and the accelerometer packages are not required to be normally mounted with respect to one another so long as three Cartesian acceleration directions can be resolved from the accelerometers selected, as will be described in detail immediately hereinafter.

Figure 8:
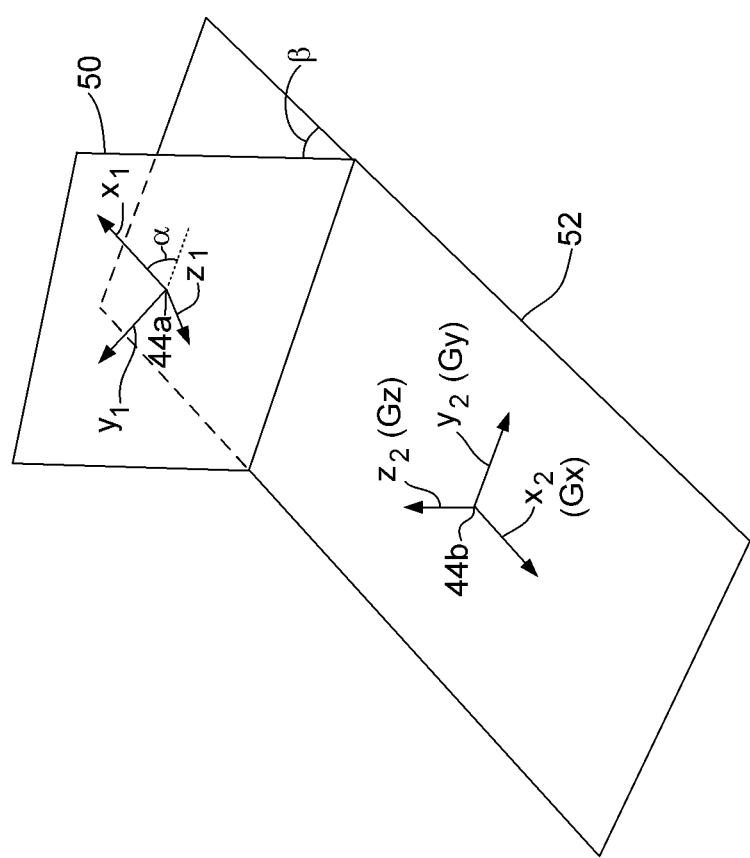
FIG. 8 is a diagrammatic illustration, in a perspective view, of another embodiment for supporting dual accelerometers in accordance with the present disclosure, wherein the accelerometers are supported on planes that are non-normal with respect to one another.

Attention is now directed to FIG. 8 which is a diagrammatic illustration, in a perspective view, of another embodiment for supporting dual accelerometers in accordance with the present disclosure. It is noted that the accelerometer axes are shown independent of physical packaging and the axes are indicated using reference designations that are taken from FIGS. 1 and 2. First circuit board 50 and second circuit board 52 are shown as planes for purposes of diagrammatic simplicity while accelerometers 44a and 44b are considered as being located at the origins of their respective coordinate axes. In the present embodiment, second circuit board 52 is supported at an acute angle β relative to first circuit board 52. The angle β can have any suitable value. In one embodiment, β can be at least approximately 45°. The $x_2$ axis can be at least approximately aligned or parallel with the elongation axis of the transmitter, as seen in FIG. 1, although this is not a requirement. The in-plane axes, $x_1$ and $y_1$ of accelerometer 44a in FIG. 1 remain at least approximately parallel to first circuit board 50 but have been rotated by an angle. The $z_1$ axis is at least approximately orthogonal to the plane of circuit board 50. In the present embodiment, angle α is at least approximately equal to 45°. In other embodiments, any suitable angle can be utilized for α. For example, α can be in the range from 20° to 160° which will allow for a sufficient projection onto axes of interest.

Still referring to FIG. 8, it should be appreciated that angles α and β can be determined at the time of manufacture and/or determined based on a calibration procedure that is performed, for example, when the transmitter and accelerometer arrangement are supported in a known physical orientation. The calibration procedure can orient the transmitter in six cardinal orientations based on three orthogonal axes that can be referenced to the housing of the transmitter. These cardinal orientations can correspond to roll positions of 0°, 90°, 180° and 270° with a pitch angle of 0°, and pitch angles of +/−90°. In this way, angles α and β can be determined as well as any angular variation of axis $x_2$ from the elongation axis of the transmitter. The orientation of each axis can be characterized in a well-known manner, for example, based on Euler angles that utilize the transmitter elongation axis and a zero roll orientation, as references.

Based on the described values for angles α and β, each axis of accelerometer 44a is skewed or exhibits an angular offset with respect to every axis of accelerometer 44b. As will be seen, the accelerometer arrangement depicted in FIG. 8, and variations thereof, provide a significant number of combinations of axes and flexibility for purposes of measuring roll and pitch orientation.

Table 3 sets forth the combinations of axes that can be used for roll and pitch orientation in accordance with the embodiment of FIG. 8. It is noted that for each combination, two axes are used for detecting the roll orientation and a different axis is used for detecting the pitch orientation. For a particular combination, the axes used for detection of roll orientation are designated using an "R" and the axis that is used for detection of pitch orientation is designated as "P". As listed in the final column of the table, the pitch measurement can be sensitive to angle β or angles α and β when the axis that is used for pitch measurement is skewed with respect to axis $x_2$, which is assumed for purposes of the present example to be parallel to the elongation axis of the transmitter. Since axis $x_2$ is assumed to be parallel to the elongation axis, no such sensitivity is exhibited (designated as "N/A" in the table) with respect to pitch measurement using $x_2$.

TABLE 3

ACCELEROMETER AXIS COMBINATIONS FOR PITCH AND ROLL

| Roll Combination | $x_1$ | $y_1$ | $z_1$ | $x_2$ | $y_2$ | $z_2$ | Pitch sensitivity proportional to: |
|---|---|---|---|---|---|---|---|
| 1a |   |   |   | P | R | R | N/A |
| 1b |   |   | P |   | R | R | sin β |
| 1c | P |   |   |   | R | R | cos β, sin α |
| 1d |   | P |   |   | R | R | cos β, cos α |
| 2a | R |   |   | P | R |   | N/A |
| 2b | R | P |   |   | R |   | cos β, cos α |
| 2c | R |   | P |   | R |   | sin β |
| 3a |   | R |   | P | R |   | N/A |
| 3b |   | R | P |   | R |   | sin β |
| 4a | R |   |   | P |   | R | N/A |
| 4b | R | P |   |   |   | R | cos β, cos α |
| 4c | R |   | P |   |   | R | sin β |
| 5a |   | R |   | P |   | R | N/A |
| 5b |   | R | P |   |   | R | sin β |
| 5c | P | R |   |   |   | R | cos β, sin α |

Accordingly, fifteen different combinations are available. It should be appreciated that these combinations can be prioritized. For example, combinations that rely on either $z_1$ or $z_2$ can be assigned a relatively lower priority than combinations that do not rely on these axes. Combinations that rely on $z_1$ and $z_2$ can be assigned still lower priority. Applicants submit that the wide range of combinations of axes in Table 1 can provide for significant immunity with respect to the failure of one or more accelerometer axes in terms of pitch and roll measurement. It is noted that 14 out of the 15 combinations given in Table 3 utilize outputs from both triaxial accelerometers.

Still referring to FIG. 8, additional combinations can be used which utilize all three axes of each accelerometer. In these embodiments, the orthogonal x, y and z accelerometer measurements taken by either accelerometer 44a or 44b can be resolved onto reference axes of the transmitter, for example, onto the transmitter elongation axis and an axis that corresponds to a zero roll orientation. In the example of FIG. 8, the transmitter elongation axis is additionally designated as Gx and corresponds to axis $x_2$ under the assumption that $x_2$ is at least approximately parallel thereto. A roll orientation reference axis Gy corresponds to axis $y_2$, assuming that the transmitter is oriented at a roll reference position of zero degrees, and a reference axis Gz that is orthogonal to both Gx and Gy. With these values in hand and in one embodiment, the roll orientation can be determined based on:

$$\text{Roll} = a\tan2(Gy, Gz) \qquad \text{EQN (5)}$$

It should be appreciated that the function a tan2 is an arctangent function with two arguments which returns the appropriate quadrant for the roll angle that is determined.

In another embodiment, the roll orientation can be determined based on $$\text{Roll} = \arctan\left[\frac{Gy}{\sqrt{Gx^2 + Gz^2}}\right] \qquad \text{EQN (6)}$$

Accordingly, even more flexibility is provided based on Equations 5 and 6 with respect to the ability to determine roll orientation.

The foregoing description of the invention has been presented for purposes of illustration and description. It is not intended to be exhaustive or to limit the invention to the precise form or forms disclosed, and other modifications and variations may be possible in light of the above teachings. Accordingly, those of skill in the art will recognize certain modifications, permutations, additions and sub-combinations of the embodiments described above.

What is claimed is:

1. An accelerometer arrangement configured for determining accelerations of a device along three orthogonal axes during an inground operation that exposes the accelerometer arrangement to a mechanical shock and vibration environment, said accelerometer arrangement comprising:
    a first MEMS triaxial accelerometer and a second MEMS triaxial accelerometer, each of which includes a set of three orthogonally arranged accelerometer sensing axes including a pair of in-plane sensing axes and a normal sensing axis such that each normal sensing axis is subject to a higher rate of failure responsive to mechanical shock and vibration than the in-plane sensing axes and the first and second MEMS triaxial accelerometers are supported with the normal sensing axis of the first MEMS triaxial accelerometer at least generally orthogonal to the normal sensing axis of the second MEMS triaxial accelerometer; and
    a processor configured to determine the accelerations along said three orthogonal axes of the device based on a combination of sensing axis outputs from the first and second triaxial accelerometers without using normal sensing axis outputs of each of the first and second triaxial accelerometers.

2. The accelerometer arrangement of claim 1 further comprising:
    a first printed circuit board that supports the first triaxial accelerometer; and
    a second printed circuit board that supports the second triaxial accelerometer.

3. The accelerometer arrangement of claim 2 wherein the second printed circuit board is supported by the first printed circuit board at least generally orthogonal thereto.

4. The accelerometer arrangement of claim 1 wherein said processor is configured to select the combination of sensing axis outputs based on a priority table.

5. The accelerometer arrangement of claim 4 wherein the first and second triaxial accelerometers provide a set of sensing axis combinations and said priority table is arranged according to a reliability of at least some of the combinations in the set of sensing axis combinations.

6. The accelerometer arrangement of claim 5 wherein a first combination and a second combination are assigned as a first priority and a second priority in the priority table and each of the first combination and the second combination exclude the normal sensing axis of the first and second triaxial accelerometers.

7. The accelerometer arrangement of claim 4 wherein the processor is configured to detect a failure of one or more sensing axes in the combination and, responsive thereto, loop through the priority table to find a usable combination of sensing axes from the set of sensing axis combinations.

8. The accelerometer arrangement of claim 7 wherein said processor is configured to loop through the priority table a plurality of times.

9. The accelerometer arrangement of claim 8 wherein said processor is configured to issue a warning responsive to looping through the priority table said plurality of times without identifying a usable combination.

10. The accelerometer arrangement of claim 7 wherein the aforerecited combination of sensing axis outputs is identified as a failed combination and the failed combination is re-tested as part of looping through the priority table to find the usable combination.

11. The accelerometer arrangement of claim 10 wherein said processor is configured to place the failed combination back into service responsive to detecting that the failed combination has become functional.

12. The accelerometer arrangement of claim 7 wherein the processor detects said failure based on a sum of the squares of a set of three outputs for the combination of sensing axes.

* * * * *